(12) United States Patent
Hisao et al.

(10) Patent No.: US 10,804,435 B2
(45) Date of Patent: Oct. 13, 2020

(54) LIGHT-EMITTING DEVICE

(71) Applicant: EPISTAR CORPORATION, Hsinchu (TW)

(72) Inventors: Chang-Tai Hisao, Hsinchu (TW); I-Lun Ma, Hsinchu (TW); Hao-Yu Chen, Hsinchu (TW); Shu-Fen Hu, Hsinchu (TW); Ru-Shi Liu, Hsinchu (TW); Chih-Ming Wang, Hsinchu (TW); Chun-Yuan Chen, Hsinchu (TW); Yih-Hua Renn, Hsinchu (TW); Chien-Hsin Wang, Hsinchu (TW); Yung-Hsiang Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 16 days.

(21) Appl. No.: 15/686,314

(22) Filed: Aug. 25, 2017

(65) Prior Publication Data

US 2018/0062043 A1 Mar. 1, 2018

(30) Foreign Application Priority Data

Aug. 25, 2016 (TW) ............................. 105127175 A
Jul. 13, 2017 (TW) ............................. 106123416 A

(51) Int. Cl.
*H01L 33/42* (2010.01)
*H01L 33/32* (2010.01)
(Continued)

(52) U.S. Cl.
CPC .............. *H01L 33/42* (2013.01); *H01L 33/32* (2013.01); *F21K 9/232* (2016.08); *F21K 9/237* (2016.08); *F21K 9/238* (2016.08); *F21V 5/04* (2013.01); *F21V 29/77* (2015.01); *F21Y 2115/10* (2016.08); *H01L 33/06* (2013.01); *H01L 33/44* (2013.01); *H01L 2933/0016* (2013.01)

(58) Field of Classification Search
None
See application file for complete search history.

(56) References Cited

U.S. PATENT DOCUMENTS 9,059,339 B1 *  6/2015  Bayram .............. H01L 33/0079
2012/0061642 A1 *  3/2012  Tanaka ................... H01L 33/42
                                                            257/13

(Continued)

FOREIGN PATENT DOCUMENTS

CN         103534204 A        1/2014

*Primary Examiner* — Nicholas J Tobergte
*Assistant Examiner* — Kien C Ly
(74) *Attorney, Agent, or Firm* — Patterson + Sheridan, LLP

(57) ABSTRACT

A light-emitting device includes a semiconductor stack including a first semiconductor layer, a second semiconductor layer, and an active layer emitting an UV light, formed between the first semiconductor layer and the second semiconductor layer; a first transparent conductive layer formed on the second semiconductor layer, the first transparent conductive layer including metal oxide; and a second transparent conductive layer formed on the first transparent conductive layer, the second transparent conductive layer including graphene, wherein the first transparent conductive layer is continuously formed over a top surface of the second semiconductor layer, the first transparent conductive layer comprises a thickness smaller than 10 nm.

17 Claims, 4 Drawing Sheets

(51) Int. Cl.

| | |
|---|---|
| H01L 33/06 | (2010.01) |
| H01L 33/44 | (2010.01) |
| F21K 9/232 | (2016.01) |
| F21V 29/77 | (2015.01) |
| F21V 5/04 | (2006.01) |
| F21K 9/238 | (2016.01) |
| F21K 9/237 | (2016.01) |
| F21Y 115/10 | (2016.01) |

(56) References Cited

U.S. PATENT DOCUMENTS

| | | | | |
|---|---|---|---|---|
| 2012/0104432 | A1* | 5/2012 | Shim | H01L 33/42 |
| | | | | 257/94 |
| 2013/0193408 | A1* | 8/2013 | Hwang | H01L 33/04 |
| | | | | 257/13 |
| 2013/0341636 | A1* | 12/2013 | Okuno | H01L 33/14 |
| | | | | 257/76 |
| 2014/0131761 | A1* | 5/2014 | Kwon | H01B 1/04 |
| | | | | 257/99 |
| 2015/0048304 | A1* | 2/2015 | Niwa | H01L 33/32 |
| | | | | 257/13 |
| 2016/0097497 | A1* | 4/2016 | Benner | F21V 3/12 |
| | | | | 313/503 |
| 2016/0099385 | A1* | 4/2016 | Kim | H01L 33/0079 |
| | | | | 257/98 |
| 2016/0099386 | A1* | 4/2016 | Youn | H01L 33/42 |
| | | | | 257/99 |

* cited by examiner

LIGHT-EMITTING DEVICE

REFERENCE TO RELATED APPLICATION

This application claims the right of priority based on TW Application Serial No. 105127175, filed on Aug. 25, 2016, the right of priority based on TW Application Serial No. 106123416, filed on Jul. 13, 2017, and the contents of which are hereby incorporated by references in their entireties.

TECHNICAL FIELD

The application relates to a light-emitting device, and more particularly, to a light-emitting device comprising a semiconductor stack and a conductive layer on the semiconductor stack.

DESCRIPTION OF BACKGROUND ART

Light-emitting diode (LED) is a solid-state semiconductor light emitting device, which has the advantages of providing lower power consumption, generating lower thermal energy, providing longer working life, being shockproof, being smaller volume, providing fast response and good photoelectric characteristics, such as stable light emission wavelength. Thus, the light-emitting diodes are widely used in household appliances, equipment indicating lights, and optoelectronic products.

SUMMARY OF THE APPLICATION

A light-emitting device includes a semiconductor stack including a first semiconductor layer, a second semiconductor layer, and an active layer formed between the first semiconductor layer and the second semiconductor layer for emitting an UV light; a first transparent conductive layer formed on the second semiconductor layer, the first transparent conductive layer including metal or metal oxide; and a second transparent conductive layer formed on the first transparent conductive layer, the second transparent conductive layer including graphene, wherein the first transparent conductive layer is continuously formed over a top surface of the second semiconductor layer without forming an interruption in the first transparent conductive layer, the first transparent conductive layer comprises a thickness smaller than 10 nm.

A manufacturing method of a light-emitting device comprises providing a semiconductor stack, the semiconductor stack comprising a first semiconductor layer, a second semiconductor layer, and an active layer formed between the first semiconductor layer and the second semiconductor layer for emitting an UV light; forming a first transparent conductive layer on the second semiconductor layer, the first transparent conductive layer comprising metal or metal oxide; and forming a second transparent conductive layer on the first transparent conductive layer, the second transparent conductive layer comprising graphene, wherein the first transparent conductive layer is continuously formed over a top surface of the second semiconductor layer without forming an interruption in the first transparent conductive layer, the first transparent conductive layer comprises a thickness smaller than 10 nm.

DETAILED DESCRIPTION OF PREFERRED EMBODIMENTS

Figure 1:
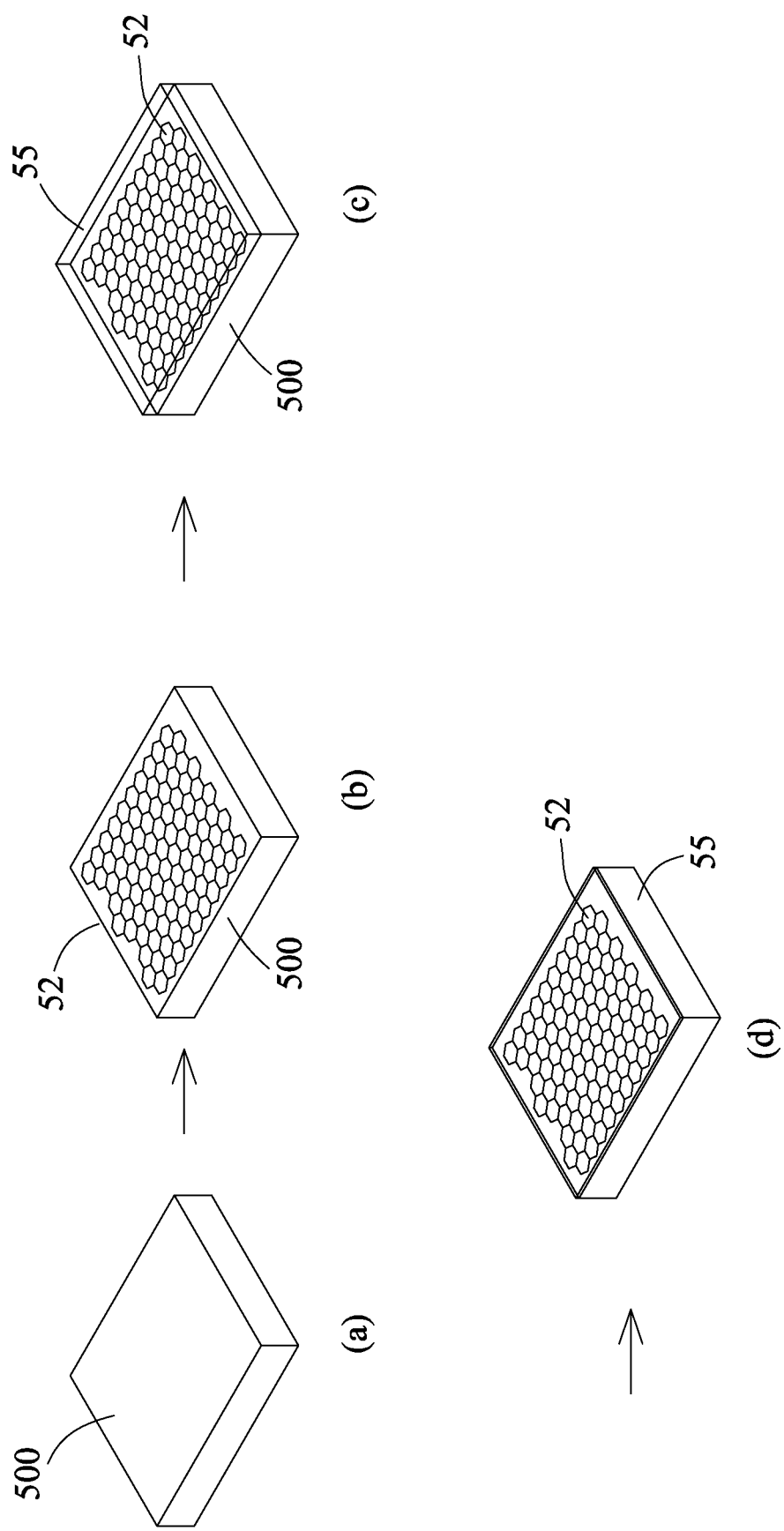
FIG. 1 illustrates a manufacturing method of a light-emitting device 1 in accordance with an embodiment of the present application.

The embodiment of the application is illustrated in detail, and is plotted in the drawings. The same or the similar part is illustrated in the drawings and the specification with the same number.

Figure 2:
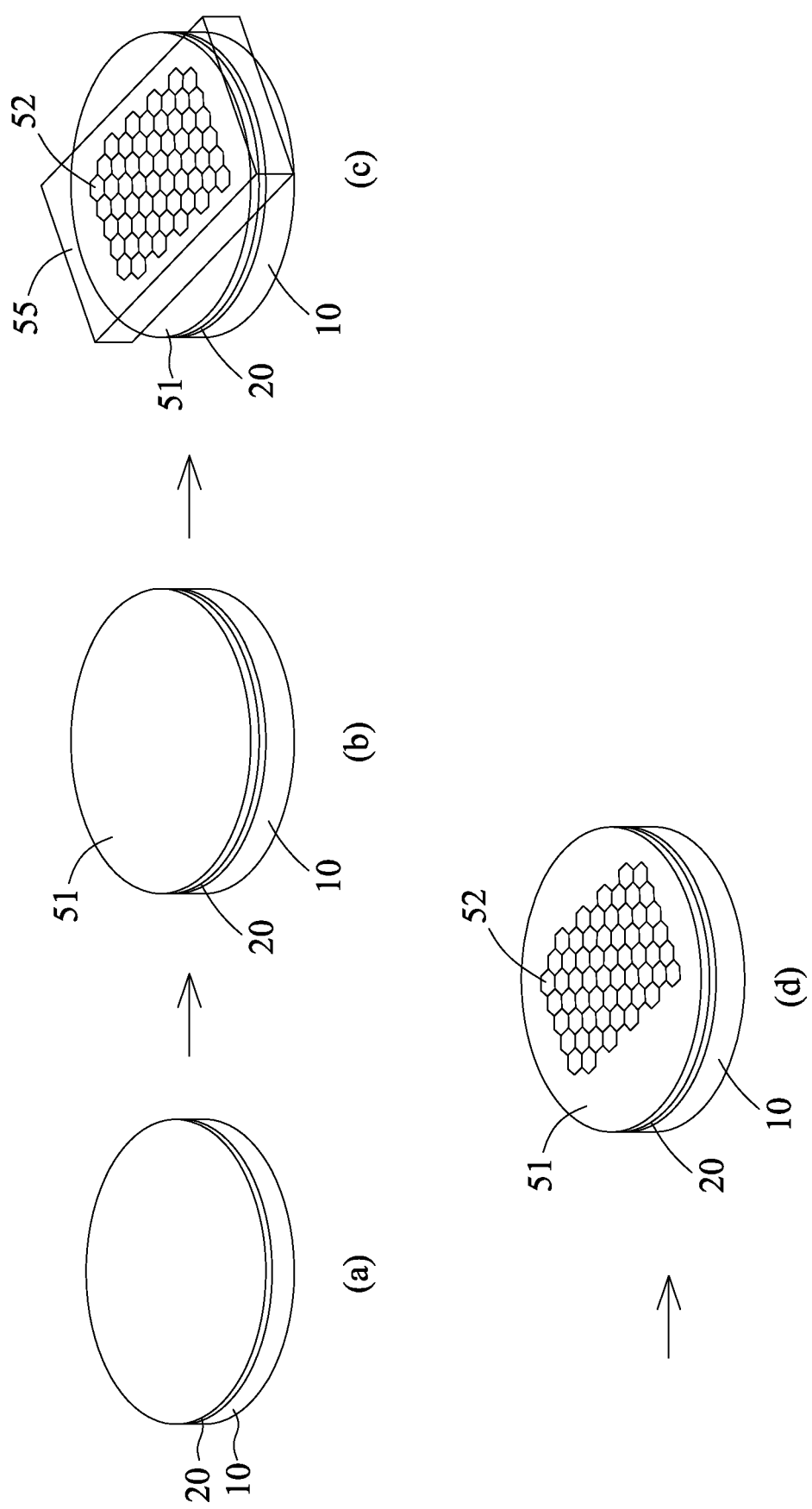
FIG. 2 illustrates a manufacturing method of the light-emitting device 1 in accordance with an embodiment of the present application.
Figure 3:
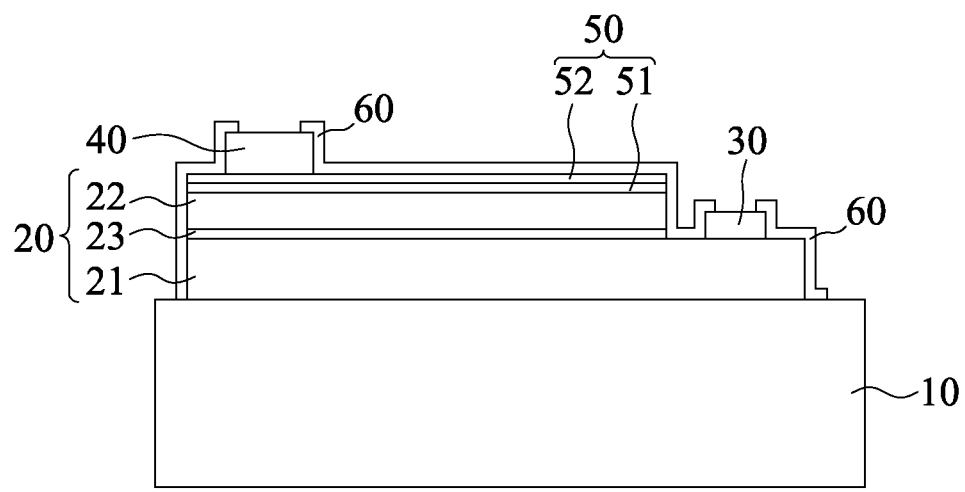
FIG. 3 illustrates a structure of the light-emitting device 1 in accordance with an embodiment of the present application.

FIGS. 1-2 illustrate a manufacturing method of a light-emitting device 1 in accordance with an embodiment of the present application. FIG. 3 illustrates a structure of the light-emitting device 1 in accordance with an embodiment of the present application.

As FIGS. 1-3 show, a manufacturing method of the light-emitting device 1 comprises providing a substrate 10; forming a semiconductor stack 20 on the substrate 10, wherein the semiconductor stack 20 comprises a first semiconductor layer 21, a second semiconductor layer 22, and an active layer 23 formed between the first semiconductor layer 21 and the second semiconductor layer 22; forming a first transparent conductive layer 51 comprising metal or metal oxide on the semiconductor stack 20; providing a carrier 500; forming a second transparent conductive layer 52 comprising graphene on the carrier 500; providing a supporting layer 55 on the second transparent conductive layer 52; removing the carrier 500; bonding the second transparent conductive layer 52 onto the first transparent conductive layer 51 comprising metal or metal oxide and removing the supporting layer 55; forming a first electrode 30 on the first semiconductor layer 21 and a second electrode 40 on the second semiconductor layer 22; and forming an insulating layer 60 to cover a surface of the semiconductor stack 20 and/or the first electrode 30, the second electrode 40.

In an embodiment of the present application, a substrate 10 is provided to be a growth substrate, which comprises gallium arsenide (GaAs) wafer for growing aluminum gallium indium phosphide (AlGaInP); sapphire ($Al_2O_3$) wafer, gallium nitride (GaN) wafer or silicon carbide (SiC) wafer for growing indium gallium nitride (InGaN).

In an embodiment of the present application, the light-emitting device 1 comprises optical characteristics, such as light-emitting angle or wavelength distribution, and electrical characteristics, such as forward voltage or reverse current. The semiconductor stack 20 can be formed on the substrate 10 by organic metal chemical vapor deposition (MOCVD), molecular beam epitaxy (MBE), hydride vapor deposition (HVPE), physical vapor deposition (PVD) or ion plating, wherein the physical vapor deposition (PVD) comprises sputtering or evaporation. The first semiconductor layer 21 and the second semiconductor layer 22, such as a cladding layer, have different conductivity types, electrical properties, polarities, or doping elements for providing electrons or holes. For example, the first semiconductor layer 21 is an n-type semiconductor and the second semiconductor layer 22 is a p-type semiconductor. The active layer 23 is formed between the first semiconductor layer 21 and the second semiconductor layer 22. The electrons and holes combine in the active layer 23 driven by a current to convert electric energy into light energy to emit a light. The wavelength of the light emitted from the light-emitting device 1 is adjusted by changing the physical and chemical composition of one or more layers in the semiconductor stack 20. The material of the semiconductor stack 20 comprises a group III-V semiconductor material, such as $Al_xIn_yGa_{(1-x-y)}N$ or $Al_xIn_yGa_{(1-x-y)}P$, wherein $0 \leq x, y \leq 1$, $(x+y) \leq 1$.

In an embodiment of the present application, the active layer 23 comprises AlGaN or AlGaInN material, and an UV light having a wavelength between 250 nm and 400 nm can be emitted from the active layer 23. The active layer 23 can be a single heterostructure (SH), a double heterostructure (DH), a double-side double heterostructure (DDH), or a multi-quantum well structure (MQW). The material of the active layer 23 can be i-type, p-type or n-type semiconductor.

In an embodiment of the present application, a buffer layer of PVD aluminum nitride (AlN) can be formed between the semiconductor stack 20 and the substrate 10 to improve the epitaxy quality of the semiconductor stack 20. In the embodiment, the target used to form PVD aluminum nitride (AlN) is composed of aluminum nitride. In another embodiment, a target made of aluminum is used to form aluminum nitride in the environment of a nitrogen source.

In an embodiment of the present application, as FIG. 1 shows, the carrier 500 is placed in a horizontal furnace tube. Hydrogen gas is injected under an inert atmosphere heated to 800° C. or higher to remove the native oxide layer formed on the surface of the carrier 500. Then, the gas source comprising carbon is injected into the furnace tube to form a second transparent conductive layer 52 comprising graphene on the surface of the carrier 500. Finally, an inert gas in injected to accelerate the cooling of the furnace tube. After lowering the temperature of the furnace tube to room temperature, the carrier 500 having the second transparent conductive layer 52 comprising graphene formed thereon is provided. After that, a supporting layer 55 is provided to adhere to the surface of the second transparent conductive layer 52 and the carrier 500 is removed from the second transparent conductive layer 52. For example, a copper foil having a thickness of 25 μm is chosen as the carrier 500 and is placed in a horizontal furnace tube. The hydrogen gas of 10 sccm is injected into the argon (Ar) atmosphere and heated to 900° C. to remove the native oxide layer on the surface of the copper foil. Then, the gas source comprising carbon, such as methane of 5 sccm, is injected to form the second transparent conductive layer 52, such as graphene, on the surface of the copper foil. Finally, the argon gas of 100 sccm is injected to cool the furnace tube. After the furnace tube is cooled down to room temperature, the copper foil having graphene formed thereon is taken out from the furnace tube. Then, a thermal release tape is used as the supporting layer 55 to adhere to the surface of the graphene formed on the copper foil. Then, the copper foil is removed from the graphene by the ferric chloride ($FeCl_3$) solution.

In an embodiment of the present application, the carrier 500 comprises metal material, which acts as a metal catalyst to grow graphene. The carrier 500 can be a flexible substrate. The shape of the carrier 500 is not limited to and includes a rectangle or a circle.

In an embodiment of the present application, the supporting layer 55 comprises polymeric material, such as polymethyl methacrylate (PMMA). The thickness of the support layer 55 is, for example, 10 nm to 2 cm.

In an embodiment of the present application, as FIG. 2 shows, a metal or a metal oxide layer having thickness between 0.1 to 5 nm, such as nickel oxide, is deposited on the semiconductor stack 20 by atomic layer chemical vapor deposition (ALD) to form the first transparent conductive layer 51. In an embodiment of the present application, the precursor is, for example, water and $NiCp_2$, and the deposition rate is 0.42 Å/cycle. In an embodiment of the present application, the thickness of the first transparent conductive layer 51 is between 0.1 and 5 nm.

In an embodiment of the present application, the first transparent conductive layer 51 is a film having good electrical conductivity and high transmittance in the UV wavelength range. The first transparent conductive layer 51 can have a thickness less than 10 nm to increase the transmittance of the first transparent conductive layer 51 in the UV wavelength range. But when the film thickness is less than 10 nm, it tends to have discontinuities in the film. The discontinuities divide the film into portions separated from each other, which increases the contact resistance of the film. When a continuous film is required, it is preferred to increase the film thickness, but it might decrease the transmittance of the film in the UV wavelength range. In an embodiment of the present application, the first transparent conductive layer 51 comprising metal or metal oxide is formed by atomic layer chemical vapor deposition (ALD). The first transparent conductive layer 51 continuously covers the semiconductor stack 20 without forming an interruption in the first transparent conductive layer 51 and having a thickness deviation less than 5 nm, preferably less than 2 nm.

In an embodiment of the present application, as FIG. 1 and FIG. 2 show, the support layer 55 is thermally pressed and heated above 130° C. to attach onto the semiconductor stack 20 having the first transparent conductive layer 51 comprising metal or metal oxide formed thereon. Then, the supporting layer 55 is removed and the second transparent conductive layer 52 comprising transparent conductive nonmetal material is formed above the first transparent conductive layer 51.

In an embodiment of the present application, the first electrode 30 and/or the second electrode 40 can be a single layer or a laminated structure. The material of the first electrode 30 and/or the second electrode 40 includes metal material, such as chromium (Cr), titanium (Ti), tungsten (W), gold (Au), aluminum (Al), indium (In), tin (Sn), nickel (Ni), platinum (Pt), or alloys of the above materials to reduce the contact resistance with the semiconductor stack 20.

In an embodiment of the present application, the material of the first electrode 30 and/or the second electrode 40 includes a metal having high reflectivity, such as aluminum (Al), silver (Ag), or platinum (Pt).

In an embodiment of the present application, the first electrode 30 and/or the second electrode 40 comprises a plurality of layers, and a layer where the first electrode 30 and/or the second electrode 40 contacting the semiconductor stack 20 comprises (Cr) or titanium (Ti) to increase the bonding strength between the first electrode 30 and/or the second electrode 40 and the semiconductor stack 20.

In an embodiment of the present application, the insulating layer 60 can protect the semiconductor layer from the external environment. The insulating layer 60 comprises transparent and non-conductive material comprising organic material, such as Sub, benzocyclobutene (BCB), perfluorocyclobutane (PFCB), epoxy, acrylic resin, cyclic olefin polymer (COC), polymethylmethacrylate (PMMA), polyethylene terephthalate (PET), polycarbonate (PC), polyetherimide, fluorocarbon polymer, or inorganic material, such as silicone, glass, or dielectric materials, such as aluminum oxide ($Al_2O_3$), silicon nitride ($SiN_x$), silicon oxide ($SiO_x$), titanium oxide ($TiO_x$), or magnesium fluoride ($MgF_x$).

FIG. 3 illustrates a structure of the light-emitting device 1 in accordance with an embodiment of the present application. The light-emitting device 1 comprises a semiconductor stack 20 comprising a first semiconductor layer 21, a second semiconductor layer 22, and an active layer 23 emitting an UV light formed between the first semiconductor layer 21 and the second semiconductor layer 22. A conductive layer 50 is formed on the second semiconductor layer 22. The conductive layer 50 comprises a first transparent conductive layer 51 comprising metal or metal oxide formed on one side adjacent to the second semiconductor layer 22 and a second transparent conductive layer 52 comprising transparent conductive non-metal material formed on another side away from the second semiconductor layer 22.

In an embodiment of the present application, the conductive layer 50 comprises a plurality of layers having different materials to form a transparent conductive electrode, wherein the conductive layer 50 occupies 70% above of a surface area of the second semiconductor layer 22, preferably 80% above, more preferably 90% above. For example, the material of the first transparent conductive layer comprises metal or metal oxide and the second transparent conductive layer 52 comprises non-metal material, such as graphene.

In an embodiment of the present application, the first transparent conductive layer 51 comprises a sheet resistance larger than that of the second transparent conductive layer 52. For example, the sheet resistance of the second transparent conductive layer 52 is larger than 4 ohm/square and the sheet resistance of the second transparent conductive layer 52 is between 2.1~3.9 ohm/square.

In an embodiment of the present application, a contact resistance between the conductive layer 50 and the second semiconductor layer 22 is lower than $10^{-3}$ $\Omega \cdot cm^2$.

In an embodiment of the present application, the second semiconductor layer 22 comprises p-type dopant having a dopant concentration larger than 1E+19 $cm^{-3}$. The p-type dopant comprises group II element, such as magnesium (Mg), beryllium (Be) or calcium (Ca) or transition element, such as zinc (Zn) or cadmium (Cd).

In an embodiment of the present application, a low resistance contact is formed between the first transparent conductive layer 51 and the second semiconductor layer 22, such as ohmic contact. In an embodiment, when the second semiconductor layer 22 is p-type GaN, the first transparent conductive layer comprises a material having a work function larger than 4.5 eV, preferably between 5 and 7 eV. When the second semiconductor layer 22 is p-type AlGaN, the first transparent conductive layer comprises a material having a work function larger than 4.5 eV, preferably between 5 and 7 eV. The material of the first transparent conductive layer 51 comprises metal or metal oxide, such as nickel oxide (NiO), cobalt oxide ($Co_3O_4$) or copper oxide ($Cu_2O$).

In an embodiment of the present application, the second semiconductor layer 22 comprises $Al_xGa_{1-x}N$, 0.55<x<0.65. The second semiconductor layer 22 comprises a thickness smaller than 1000 Å or between 250 Å and 1000 Å. The light-emitting device 1 comprises a contact layer (not shown) between the second semiconductor layer 22 and the first transparent conductive layer 51 comprising metal or metal oxide, wherein the contact layer comprises GaN. Because GaN absorbs UV light, it is preferred to decrease the thickness of the contact layer to increase the transmittance of the contact layer in the UV wavelength range. A low resistance contact, such as ohmic contact, is formed between the contact layer and the first transparent conductive layer 51 comprising metal or metal oxide. In an embodiment, the thickness of the contact layer is smaller than 150 Å or between 50 Å and 150 Å. When the thickness of the GaN layer is smaller than 100 Å, more than 90% of the light can be extracted from the light-emitting device 1. The contact layer comprising GaN comprises p-type dopant having a dopant concentration larger than $1*10^{20}$ $cm^{-3}$ or between $1*10^{20}$ and $2*10^{20}$ $cm^{-3}$ for forming ohmic contact between the contact layer and the first transparent conductive layer 51.

In an embodiment of the present application, the second semiconductor layer 22 comprises $Al_xGa_{1-x}N$, and the light-emitting device 1 comprises a contact layer (not shown) between the second semiconductor layer 22 and the first transparent conductive layer 51. The contact layer comprises $Al_yGa_{1-y}N$, x, y>0 and x>y. The second semiconductor layer 22 comprises a thickness smaller than 1000 Å or between 250 Å and 1000 Å. The contact layer comprises a thickness smaller than 150 Å or between 50 Å and 150 Å. The contact layer comprising AlGaN comprises p-type dopant having a dopant concentration larger than $1*10^{19}$ $cm^{-3}$ or between $1*10^{19}$ and $8*10^{19}$ $cm^{-3}$ so an ohmic contact is formed between the contact layer and the first transparent conductive layer 51.

In an embodiment of the present application, the second semiconductor layer 22 comprises $Al_xGa_{1-x}N$, and the light-emitting device 1 comprises a contact layer (not shown) between the second semiconductor layer 22 and the first transparent conductive layer 51. The contact layer comprises $Al_yGa_{1-y}N$, wherein 0.55<x<0.65, 0.05<y<0.1.

In an embodiment of the present application, the contact layer comprises $Al_yGa_{1-y}N$ having p-type dopant, for example, group II element, such as magnesium (Mg), beryllium (Be) or calcium (Ca), or transition element, such as, zinc (Zn), cadmium (Cd). Preferably, 0.01≤y≤0.1.

In an embodiment of the present application, the contact layer comprises $Al_yGa_{1-y}N$ having p-type dopant comprising a dopant concentration larger than $1*10^{19}$ $cm^{-3}$ or between $1*10^{19}$ and $8*10^{19}$ $cm^{-3}$.

In an embodiment of the present application, a contact resistance between the conductive layer 50 and the contact layer is lower than $10^{-3}$ $\Omega \cdot cm^2$.

In an embodiment of the present application, the metal oxide of the first transparent conductive layer 51 comprises a metal having a plurality of oxidation states. For example, the nickel atom of the nickel oxide ($NiO_x$) comprises a first oxidation state of +2 valence and a second oxidation state of +3 valence.

In an embodiment of the present application, the metal oxide of the first transparent conductive layer 51 comprises a metal having a single oxidation state.

In an embodiment of the present application, the stoichiometric ratio of the metal to oxygen of the metal oxide of the first transparent conductive layer 51 is not equal to one.

In an embodiment of the present application, the first transparent conductive layer 51 comprises p-type dopant to lower the contact resistance.

In an embodiment of the present application, the metal oxide of the first transparent conductive layer 51 comprises an energy gap larger than 3 eV, preferably larger than 3.2 eV, more preferably larger than 3.4 eV. For example, metal oxide, such as nickel oxide ($NiO_x$) comprises an energy gap between 3.6 and 4 eV.

In an embodiment of the present application, the first transparent conductive layer 51 continuously covers the second semiconductor layer 22. The first transparent conductive layer 51 comprises a thickness smaller than 10 nm, preferably smaller than 5 nm, more preferably smaller than 2 nm. The first transparent conductive layer 51 comprises a thickness variation smaller than 5 nm, preferably smaller than 2 nm. In an embodiment, the first transparent conductive layer 51 continuously covers the second semiconductor layer 22 such that the upper surface of the second semiconductor layer 22 is covered by the first transparent conductive layer 51 without forming an interruption in the first transparent conductive layer 51 which exposes the upper surface of the second semiconductor layer 22.

In an embodiment of the present application, the first transparent conductive layer 51 or the second transparent conductive layer 52 has a transmittance of 80% or more for wavelength between 200 and 280 nm.

In an embodiment of the present application, the second transparent conductive layer 52 comprises transparent conductive material, such as graphene. Graphene is a two-dimensional material comprising a hexagon structure composed of carbon atoms with $sp^2$ orbital bonds. The length of carbon-carbon bond in the graphene structure is about 0.142 nm, the area of the hexagonal structure is about 0.052 $nm^2$, and the thickness of the single graphene layer is 0.34 nm. The graphene has a thermal conductivity higher than 5300 W/m·K, an electron mobility higher than 15000 $cm^2$/V·s and a resistivity less than $10^{16}$ Ω·cm.

In an embodiment of the present application, the second transparent conductive layer 52 comprises p-type dopant comprising group II element, such as magnesium (Mg), zinc (Zn), cadmium (Cd), beryllium (Be), or calcium (Ca).

In an embodiment of the present application, the second transparent conductive layer 52 comprises a plurality of sub-layers, such as 2 to 10 graphene layers.

In an embodiment of the present application, the graphene layer comprises a plurality of units and each unit comprises a hexagon shape formed by carbon elements. The plurality of units is connected to each other to form a two-dimensional material with an armchair structure or a zigzag structure.

In an embodiment of the present application, one or more graphene layers are stacked to form the second transparent conductive layer 52, wherein each graphene layer comprises a thickness.

Figure 4:
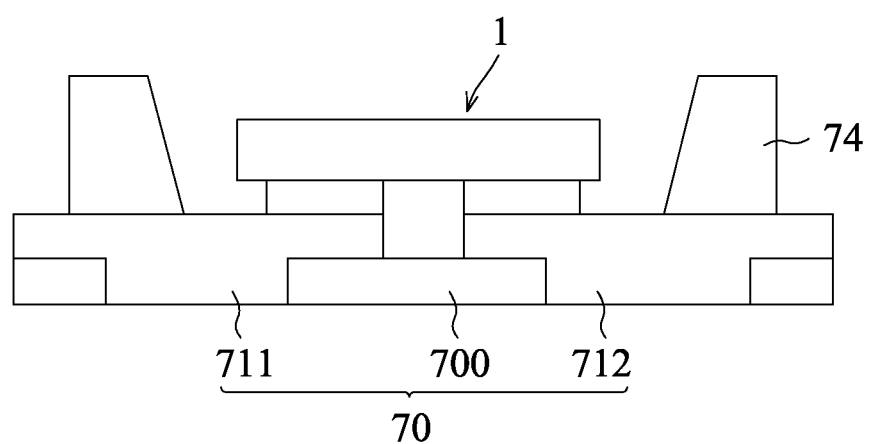
FIG. 4 illustrates a structure of a light-emitting apparatus 2 in accordance with an embodiment of the present application.

FIG. 4 is a schematic view of a light-emitting apparatus 2 according to an embodiment of the present application. The light-emitting device 1 in the foregoing embodiment is mounted on the first spacer 711 and the second spacer 712 of the package substrate 70 in the form of flip chip. The first spacer 711 and the second spacer 712 are electrically insulated from each other by an insulating portion 700 comprising an insulating material. The main light-extraction surface of the flip-chip is the surface of the growth substrates to reduce the light absorption on the electrode surface. A reflective structure 74 can be provided around the light-emitting device 1 to increase the light extraction efficiency of the light-emitting apparatus 2.

Figure 5:
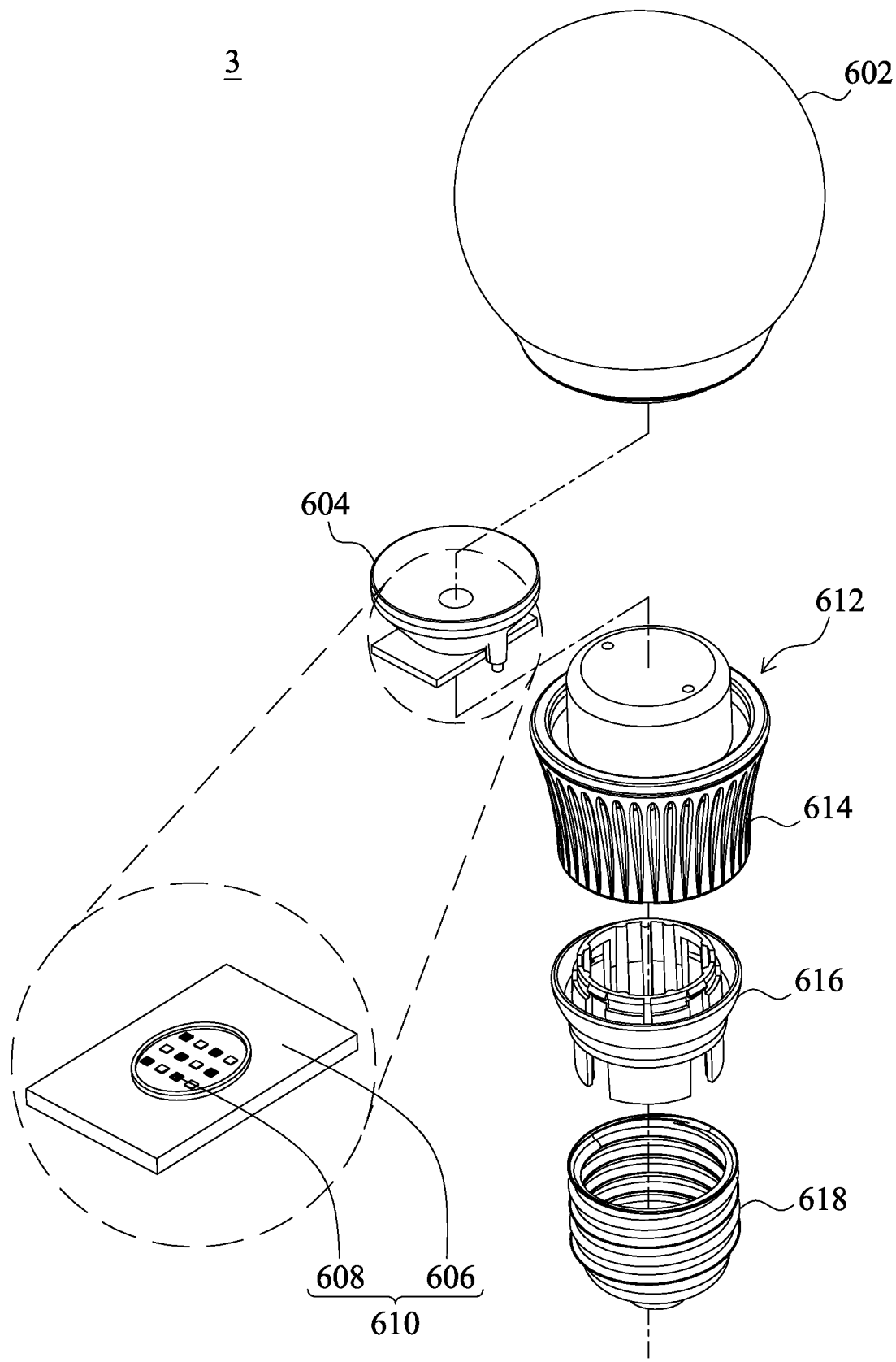
FIG. 5 illustrates a structure of a light-emitting apparatus 3 in accordance with an embodiment of the present application.

FIG. 5 is a schematic view of a light-emitting apparatus 3 according to an embodiment of the present application. The light-emitting apparatus 3 can be a light bulb 600 including an envelope 602, a lens 604, a light-emitting module 610, a base 612, a heat sink 614, a connector 616 and an electrical connecting device 618. The light-emitting module 610 includes a submount 606 and one or a plurality of light-emitting devices 608 formed on the submount 606, wherein the one or the plurality of light-emitting devices 608 can be same as the light-emitting device 1 or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a semiconductor stack comprising a first semiconductor layer, a second semiconductor layer, and an active layer formed between the first semiconductor layer and the second semiconductor layer, wherein the active layer is capable of emitting an UV light;
   a first transparent conductive layer including metal or metal oxide formed on an upper surface of the second semiconductor layer;
   a second transparent conductive layer including transparent conductive non-metal material formed on the first transparent conductive layer;
   a contact layer between the second semiconductor layer and the first transparent conductive layer, wherein the second semiconductor layer comprises $Al_xGa_{1-x}N$, and the contact layer comprises $Al_yGa_{1-y}N$, 0<x, y≤1, and x>y; and
   a first electrode formed on the first semiconductor layer and a second electrode formed on the second transparent conductive layer, wherein the second electrode is devoid of contacting the first transparent conductive layer from a cross-section of the light-emitting device, and wherein the first transparent conductive layer is continuously formed over the upper surface of the second semiconductor layer.

2. The light-emitting device of claim 1, wherein the metal oxide comprises a work function between 4.5 eV and 7 eV.

3. The light-emitting device of claim 1, wherein the metal oxide comprises a metal comprising a first oxidation state and a second oxidation state.

4. The light-emitting device of claim 1, wherein the UV light comprises a wavelength between 100 and 290 nm.

5. The light-emitting device of claim 1, wherein the second semiconductor layer comprises $Al_xGa_{1-x}N$, 0.55<x<0.65 and the contact layer comprises $Al_yGa_{1-y}N$, 0.05<y<0.1.

6. The light-emitting device of claim 1, wherein the first transparent conductive layer comprises a sheet resistance larger than a sheet resistance of the second transparent conductive layer.

7. The light-emitting device of claim 1, wherein the second transparent conductive layer comprises a plurality of sub-layers.

8. The light-emitting device of claim 1, wherein the transparent conductive non-metal material comprises carbon.

9. The light-emitting device of claim 1, wherein the transparent conductive non-metal material comprises graphene.

10. The light-emitting device of claim 1, wherein the contact layer comprises p-type dopant, and a dopant concentration of the p-type dopant is between $1*10^{19}$ $cm^{-3}$ and $8*10^{19}$ $cm^{-3}$.

11. The light-emitting device of claim 1, wherein the first transparent conductive layer comprises a thickness deviation in a range between 5 nm and 2 nm.

12. The light-emitting device of claim 1, wherein the contact layer comprises p-type dopants, and a dopant concentration of the p-type dopant is between $1*10^{20}$ cm$^{-3}$ and $2*10^{20}$ cm$^{-3}$.

13. The light-emitting device of claim 1, wherein the second electrode contacts the second transparent conductive layer.

14. The light-emitting device of claim 1, wherein $0.01 \leq y \leq 0.1$.

15. The light-emitting device of claim 1, wherein the contact layer comprises a thickness between 50 Å and 150 Å.

16. The light-emitting device of claim 1, wherein the second semiconductor layer comprises a thickness between 250 Å and 1000 Å.

17. The light-emitting device of claim 1, wherein the first transparent conductive layer comprises a thickness between 0.1 nm and 10 nm.

* * * * *